(12) United States Patent
Ishida et al.

(10) Patent No.: US 12,513,871 B2
(45) Date of Patent: Dec. 30, 2025

(54) IMAGE DISPLAY DEVICE

(71) Applicant: Panasonic Intellectual Property Management Co., Ltd., Osaka (JP)

(72) Inventors: Shinya Ishida, Osaka (JP); Yuuki Gotou, Osaka (JP); Yoshiaki Okihara, Osaka (JP); Hideaki Takikura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 207 days.

(21) Appl. No.: 18/277,030

(22) PCT Filed: Oct. 15, 2021

(86) PCT No.: PCT/JP2021/038281
§ 371 (c)(1),
(2) Date: Aug. 11, 2023

(87) PCT Pub. No.: WO2022/176272
PCT Pub. Date: Aug. 25, 2022

(65) Prior Publication Data
US 2024/0121926 A1    Apr. 11, 2024

(30) Foreign Application Priority Data

Feb. 17, 2021    (JP) .................................. 2021-023713

(51) Int. Cl.
*H05K 7/20*        (2006.01)
(52) U.S. Cl.
CPC ............................... *H05K 7/20963* (2013.01)

(58) Field of Classification Search
None
See application file for complete search history.

(56) References Cited

U.S. PATENT DOCUMENTS

| 5,734,989 A | * | 3/1998 | Woodcock | .............. B60T 15/14 340/9.1 |
| 7,505,270 B2 | * | 3/2009 | Kim | ...................... G06F 1/1601 361/708 |

(Continued)

FOREIGN PATENT DOCUMENTS

| JP | 2005-107487 A | 4/2005 |
| JP | 2016-035534 A | 3/2016 |

(Continued)

OTHER PUBLICATIONS

WO 2016208192 A1 translation (Year: 2016).*

(Continued)

*Primary Examiner* — Mukundbhai G Patel
(74) *Attorney, Agent, or Firm* — Rimon P.C.

(57) ABSTRACT

An image display device includes: a display panel that displays an image on a front surface; a support member that is plate-like and is disposed on a back surface side of the display panel; a fixing member; and a heat conduction member. The fixing member fixes the display panel to the support member with a distance therebetween. The heat conduction member is disposed between the display panel and the support member. The heat conduction member is a plate-like member, and has a thickness less than a separation distance between the display panel and the support member.

8 Claims, 9 Drawing Sheets

(56) References Cited

U.S. PATENT DOCUMENTS

| | | | |
|---|---|---|---|
| 2005/0068738 A1 | 3/2005 | Kim et al. | |
| 2005/0286228 A1* | 12/2005 | Kim | H05K 7/20963 |
| | | | 361/704 |
| 2013/0128541 A1 | 5/2013 | Kuo et al. | |
| 2016/0027718 A1* | 1/2016 | Park | H10K 50/87 |
| | | | 165/80.3 |
| 2016/0033821 A1 | 2/2016 | Yasuda | |
| 2018/0098461 A1 | 4/2018 | Matsuno et al. | |
| 2020/0280796 A1 | 9/2020 | Lee et al. | |

FOREIGN PATENT DOCUMENTS

| | | | | |
|---|---|---|---|---|
| JP | 2020-145674 A | 9/2020 | | |
| WO | WO-2016208192 A1 * | 12/2016 | ....... | G02F 1/133382 |

OTHER PUBLICATIONS

International Search Report issued on Dec. 21, 2021 in International Patent Application No. PCT/JP2021/038281, with English translation.

Extended European Search Report dated Jul. 9, 2024 issued in the corresponding European Patent Application No. 21926701.0.

* cited by examiner

IMAGE DISPLAY DEVICE

CROSS-REFERENCE OF RELATED APPLICATIONS

This application is the U.S. National Phase under 35 U.S.C. § 371 of International Patent Application No. PCT/JP2021/038281, filed on Oct. 15, 2021, which in turn claims the benefit of Japanese Patent Application No. 2021-023713, filed on Feb. 17, 2021, the entire disclosures of which Applications are incorporated by reference herein.

TECHNICAL FIELD

The present disclosure relates to an image display device including a display panel that displays an image.

BACKGROUND ART

Patent Literature (PTL) 1 discloses a heat dissipation structure in a display device. Specifically, the display device adopts a structure that dissipates heat generated from a light source board, namely a heat generation source, by pressing a heat sink against the back surface of the light source board using screw fastening power.

CITATION LIST

Patent Literature

[PTL 1] Japanese Unexamined Patent Application Publication No. 2016-35534

SUMMARY OF INVENTION

Technical Problem

The present disclosure provides an image display device that can be efficiently manufactured and can achieve improvement in image quality.

Solution to Problem

An image display device according to the present disclosure includes: a display panel that displays an image on a front surface; a support member that is plate-like and is disposed on a back surface side of the display panel; a fixing member that fixes the display panel to the support member with a distance therebetween; and a heat conduction member that is plate-like, is disposed between the display panel and the support member, and has a thickness less than a separation distance between the display panel and the support member.

Advantageous Effects of Invention

The present disclosure can provide an image display device that can be efficiently manufactured and can achieve improvement in image quality.

DESCRIPTION OF EMBODIMENTS

The inventors of the present application have found occurrences of the following problems relating to conventional image display devices. Conventionally, television receivers including a display panel (organic electro-luminescence (EL) panel) using organic light-emitting diodes (OLEDs) have been present, for example.

Since an organic EL panel is a display panel of a spontaneous light emission type, the organic EL panel generates heat by light emission. This heat causes a change in a light emission property of OLED elements, resulting in a reduction in the quality of a display image. For this reason, a structure that efficiently and externally dissipates heat generated in organic EL panels is sought after. In view of the above, pressing of a plate-like support member supporting an organic EL panel against the back surface of the organic EL panel may be considered in the same manner as the heat sink disclosed in the above-described Background Art section, for example. In this case, a heat generation source subject to heat dissipation is the organic EL panel (display panel) that displays an image. For this reason, creation of a threaded hole in the display panel to press a support member against the display panel is difficult or impossible. Accordingly, the support member may be attached to the back surface of a display panel with a joining member such as a double-sided adhesive tape interposed therebetween, for example. In this configuration, the support member is attached to the entire back surface of the display panel so as to completely remove an air gap between the display panel and the support member. With this, almost the entire back surface of the display panel can be in contact with the support member with a joining member interposed therebetween. However, when almost the entire back surface of the display panel is attached to the support member with a joining member such as a double-sided adhesive tape, air bubbles tend to remain between the joining member and the display panel, for example. These air bubbles cause a local increase in a temperature in a display panel. For example, when a support member has unevenness in a thickness direction, spaces are partially made between the joining member and the support member. This also causes a local increase in a temperature of the display panel. As a result, display irregularities such as color and luminance irregularities become conspicuous in a display image displayed by the display panel. Since a rework on attaching a support member is materially impossible when the display panel is an extremely thin (e.g., approximately 1 mm) organic EL panel, the display panel is discarded when an error in attachment occurs.

The present disclosure is based on the above-described knowledge. As a result of conducting in-depth study, the inventors of the present application came up with an idea of an image display device that can be efficiently manufactured and can achieve improvement in image quality.

Hereinafter, embodiments will be described with reference to the drawings as appropriate. However, unnecessarily detailed description may be omitted. For example, detailed description on items already widely known and redundant description on substantially the same configuration may be omitted. This is to avoid unnecessary redundancy in the following description to facilitate understanding by a person skilled in the art.

Note that the inventors of the present application provide the drawings and the following description in order that a person skilled in the art can sufficiently understand the present disclosure. Therefore, the drawings and the following description are not intended to limit the subject matter of the claims.

For convenience of description, the up-down direction, the forward-backward direction, and the left-right direction match the Z axis direction, the Y axis direction, and the X axis direction, respectively, in the following embodiments and variations. However, these associations do not limit the orientations of an image display device according to the present disclosure during manufacturing processes or at the time of usage. In the following description, the positive side of the X axis indicates a direction at which the arrow of the X axis points, for example. Alternatively, the negative side of the X axis indicates the opposite side of the positive side of the X axis, for example. The same applies to the Y axis direction and Z axis direction. The drawings each are a schematic diagram, and do not necessarily provide strictly accurate illustration. Accordingly, the drawings do not necessarily coincide with one another in terms of scales and the like.

Embodiment

[1. Configuration Outline of Image Display Device]

Figure 1:
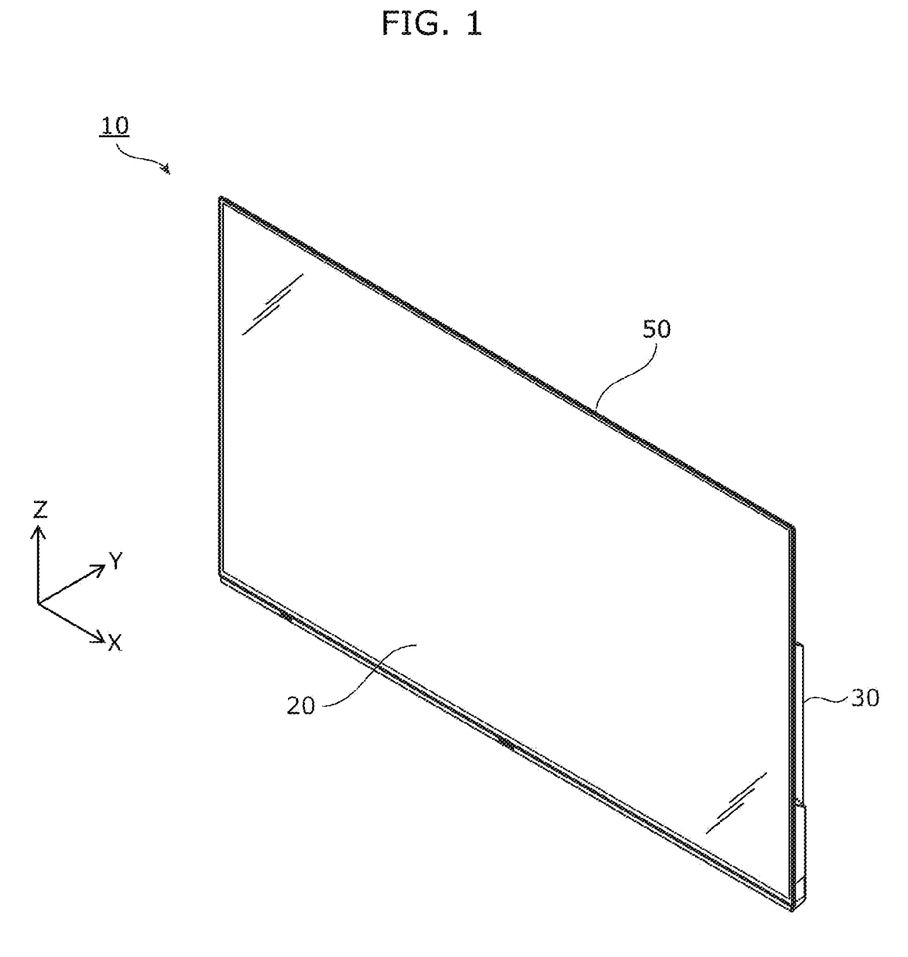
FIG. 1 is a perspective view of an external appearance of an image display device according to an embodiment.
Figure 2:
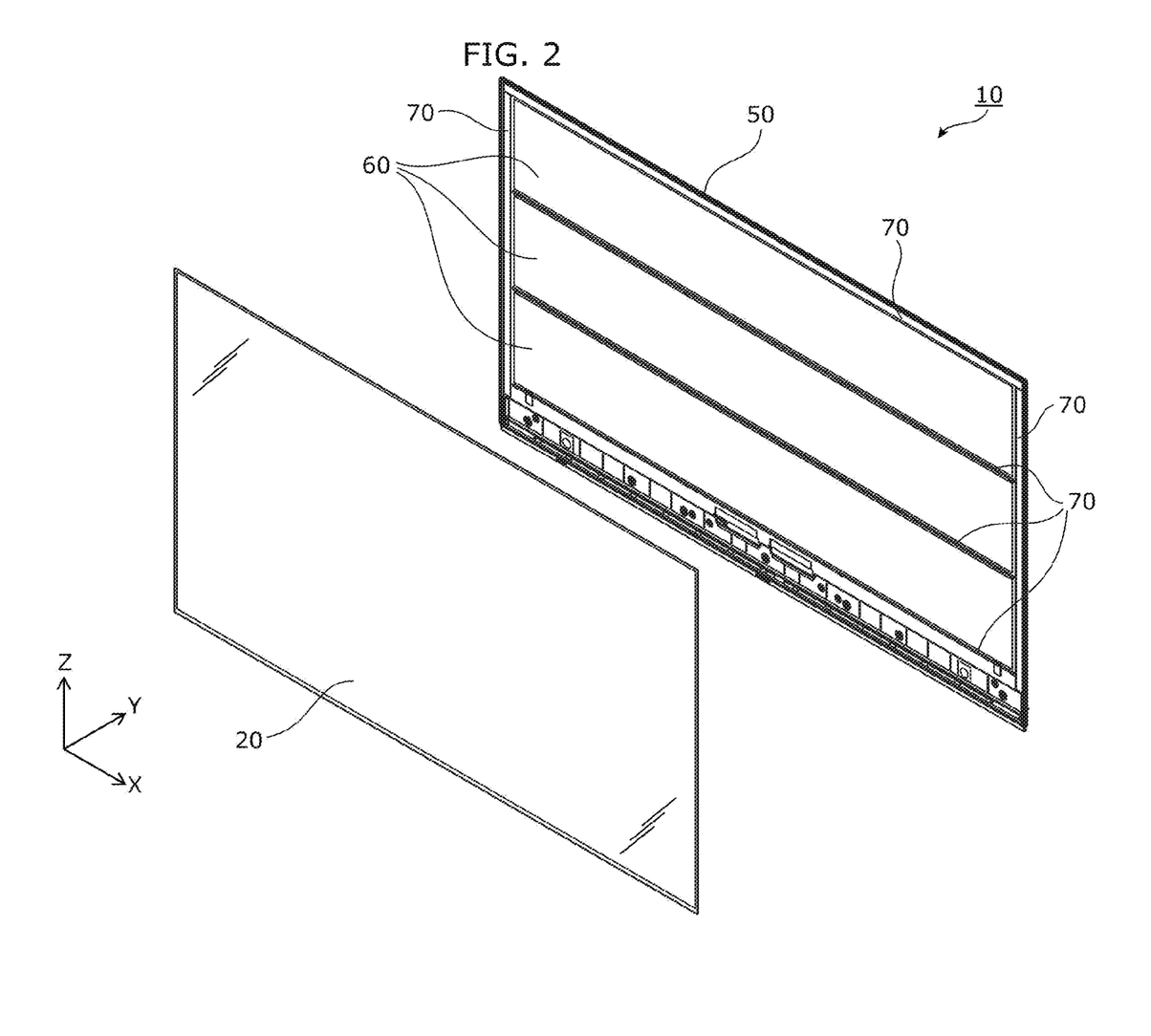
FIG. 2 is a perspective view of a display panel and a support member according to the embodiment which are illustrated separated from each other.
Figure 3:
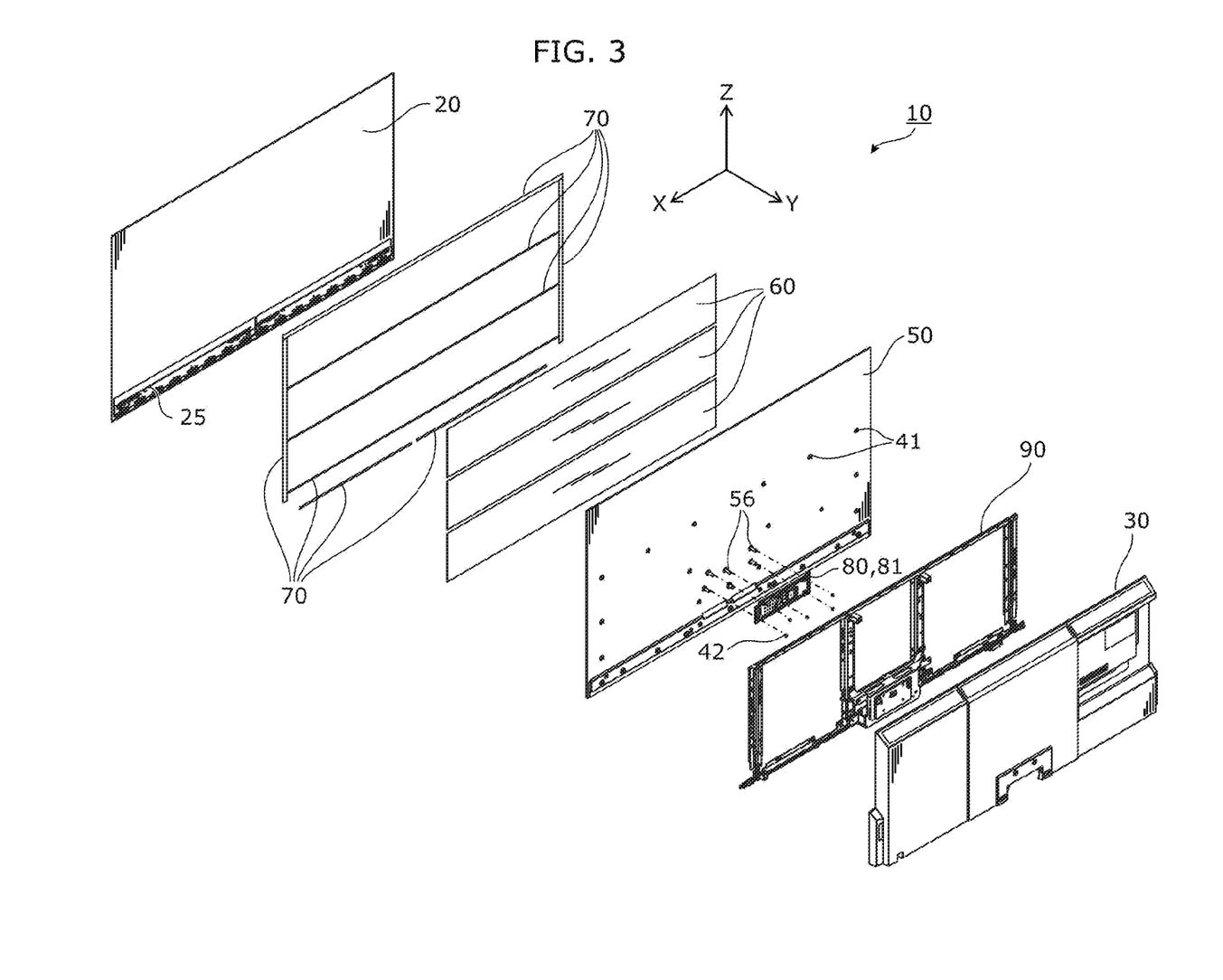
FIG. 3 is an exploded perspective view of the image display device according to the embodiment.

First, a configuration outline of image display device 10 according to an embodiment will be described with reference to FIG. 1 through FIG. 3. FIG. 1 is a perspective view of an external appearance of image display device 10 according to an embodiment. FIG. 2 is a perspective view of display panel 20 and support member 50 according to the embodiment which are illustrated separated from each other. FIG. 3 is an exploded perspective view of image display device 10 according to the embodiment. FIG. 1 and FIG. 2 each are a perspective view of image display device 10, diagonally viewing image display device 10 from the front of image display device 10. FIG. 3 is a perspective view of image display device 10, diagonally viewing image display device 10 from the rear of image display device 10. FIG. 2 and FIG. 3 omit illustrations of other members such as lines included in image display device 10. FIG. 3 illustrates display panel 20 whose lower edge is attached with source circuit board 25 that supplies a signal voltage to display panel 20.

Image display device 10 according to the embodiment includes display panel 20 that displays a still image and a moving image. Image display device 10 is used as, for example, a television receiver, a monitor display, a digital signage, or the like.

As illustrated in FIG. 1 through FIG. 2, image display device 10 includes display panel 20 that displays an image, support member 50 disposed on the back surface side of display panel 20, and resin back cover 30 that covers an area from a center portion to a lower edge portion in the back surface of support member 50 in the up-down direction.

To be more specific, with fixing member 70, one of display panel 20 and support member 50 is fixed to the other of display panel and support member 50 with a distance therebetween. Plate-like heat conduction member 60 is disposed between display panel 20 and support member 50. Control circuit board 80 that controls source circuit board 25 and board cover 81 are attached to the back surface of support member 50. Mounting bracket 90 is further fixed to the back surface of support member 50. Back cover 30 is attached to support member 50 with mounting bracket 90 interposed therebetween.

Display panel 20 in this embodiment is a display panel of a spontaneous light emission type. To be more specific, display panel 20 is an organic EL panel. Although display panel 20 that is an organic EL panel includes an EL board, a glass board (CF board) on which a color filter is provided, a resin layer between the EL board and the CF board, a heat dissipation sheet, etc., detailed illustrations and description of these elements are omitted. Display panel 20 is fixed to support member 50 with fixing member 70 that is, for example, a double-sided adhesive tape. As illustrated in FIG. 2 and FIG. 3, each of a plurality of double-sided adhesive tapes is disposed as fixing member 70 in this embodiment.

Support member 50 is a plate-like member disposed on the back surface side of display panel 20. In this embodiment, support member 50 includes a composite material consisting of a pair of metal plates of aluminum between which resin is sandwiched. With this, support member 50 can reduce its weight (weight lightening), while ensuring predetermined rigidity necessary for supporting display panel 20. The material of support member 50 is not limited to the above. Support member 50 may be manufactured by performing, for example, press work on a metal material such as iron or aluminum. Support member 50 may be manufactured using only a resin material. In order to efficiently dissipate heat of display panel 20, at least a part of support member 50 suitably includes a metal material.

As illustrated in FIG. 3, support member 50 is provided with a plurality of bosses 56 that protrude from the back surface of support member 50. Control circuit board 80 and board cover 81 are fixed to these bosses 56 with screws 42. Support member 50 is further provided with a plurality of screws 41 that penetrate support member 50 and protrude from the back surface of support member 50. With the plurality of screws 41, mounting bracket 90 is fastened to support member 50.

Heat conduction member 60 is a plate-like member including, for example, resin, metal, or carbon. Heat conduction member 60 conducts heat of display panel 20 to support member 50. Specifically, a space having a thickness of fixing member 70 is provided between display panel 20 and support member 50. The heat of display panel 20 is conducted to support member 50 through heat conduction member 60 disposed in the space. As illustrated in FIG. 2 and FIG. 3, three heat conduction members 60 aligned in the up-down direction are disposed between display panel 20 and support member 50 in this embodiment. Fixing members 70 are disposed surrounding these three heat conduction members 60. Since the surfaces of support member 50 is metal (aluminum in this embodiment), support member 50 can efficiently receive and diffuse heat conducted from display panel 20 through heat conduction member 60.

In this embodiment, the thickness of heat conduction member 60 is less than a distance between display panel 20 and support member 50. Only one surface out of the two surfaces of heat conduction member 60 in the thickness direction is disposed in contact with display panel 20 or support member 50. To be more specific, the space between display panel 20 and support member 50 cannot be completely filled by heat conduction member 60 in an arrangement direction (Y axis direction) of display panel 20 and support member 50. A configuration of heat conduction member 60 and elements in the vicinity of heat conduction member 60 will be described later with reference to FIG. 4 through FIG. 7.

Back cover 30 is a member that covers electrical components such as control circuit board 80 and lines disposed on the back surface of support member 50. Back cover 30 includes a resin material such as polycarbonate (PC) or acrylonitrile butadiene styrene resin (ABS) resin. Although back cover 30 includes a combination of members, this group of members is treated as back cover 30 in this embodiment. With screws and the like not illustrated, back cover 30 is fixed to mounting bracket 90 and boss 56 provided for fixing back cover 30.

Mounting bracket 90 is a member including metal frames assembled vertically and horizontally. Mounting bracket 90 plays a role in reinforcing support member 50 from its back surface by being fixed to support member 50 with screws 41.

[2. Configuration of Heat Conduction Member and Elements in the Vicinity Thereof]

Next, a configuration of heat conduction member 60 and elements in the vicinity of heat conduction member 60 in image display device 10 according to the embodiment will be described with reference to FIG. 4 through FIG. 7.

Figure 4:
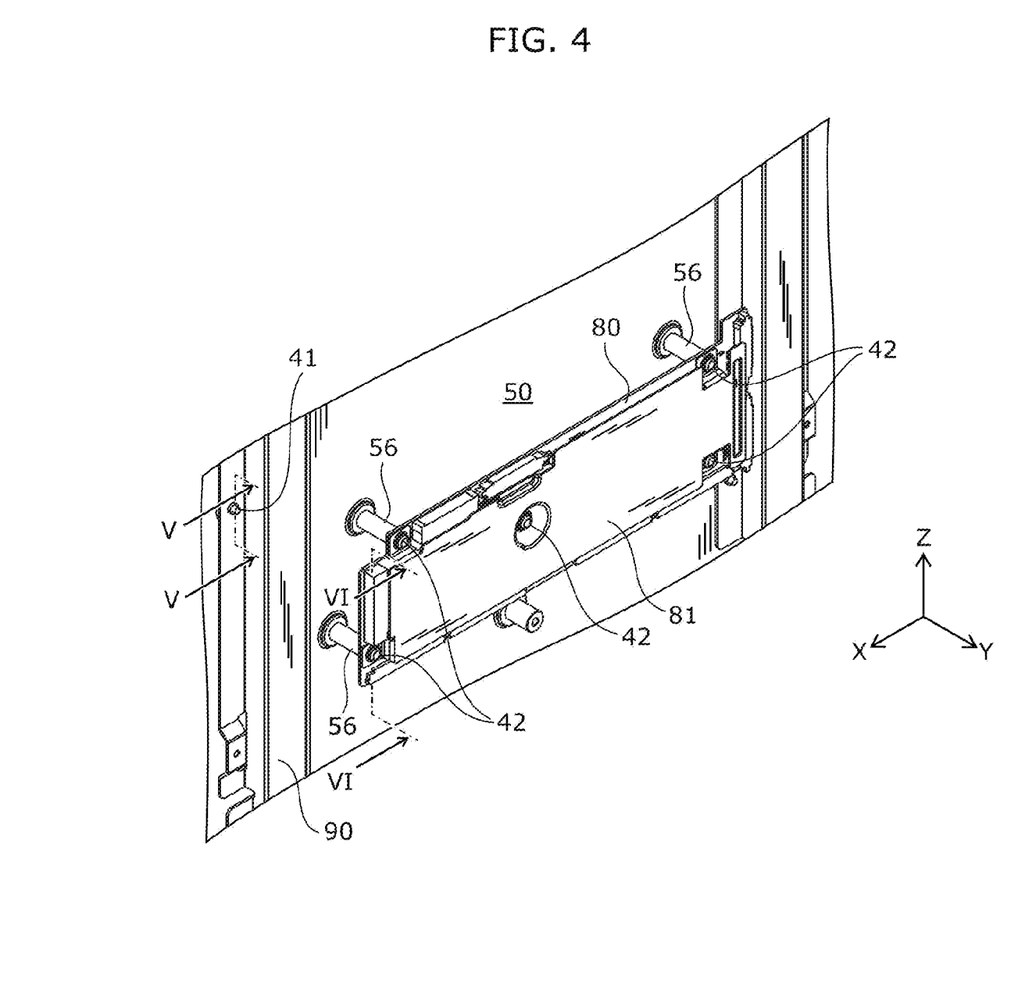
FIG. 4 is a perspective view of part of a back surface of the support member according to the embodiment.
Figure 5:
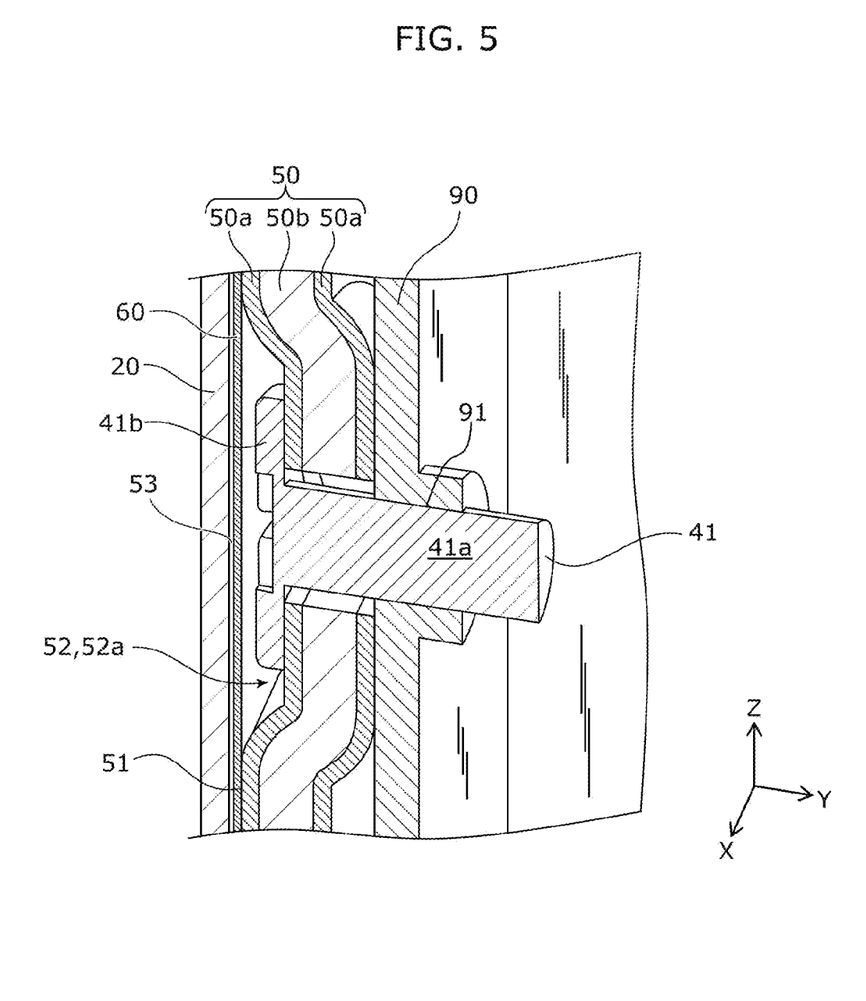
FIG. 5 is a perspective, cross-sectional view of a portion in which a screw is disposed in the image display device according to the embodiment.
Figure 6:
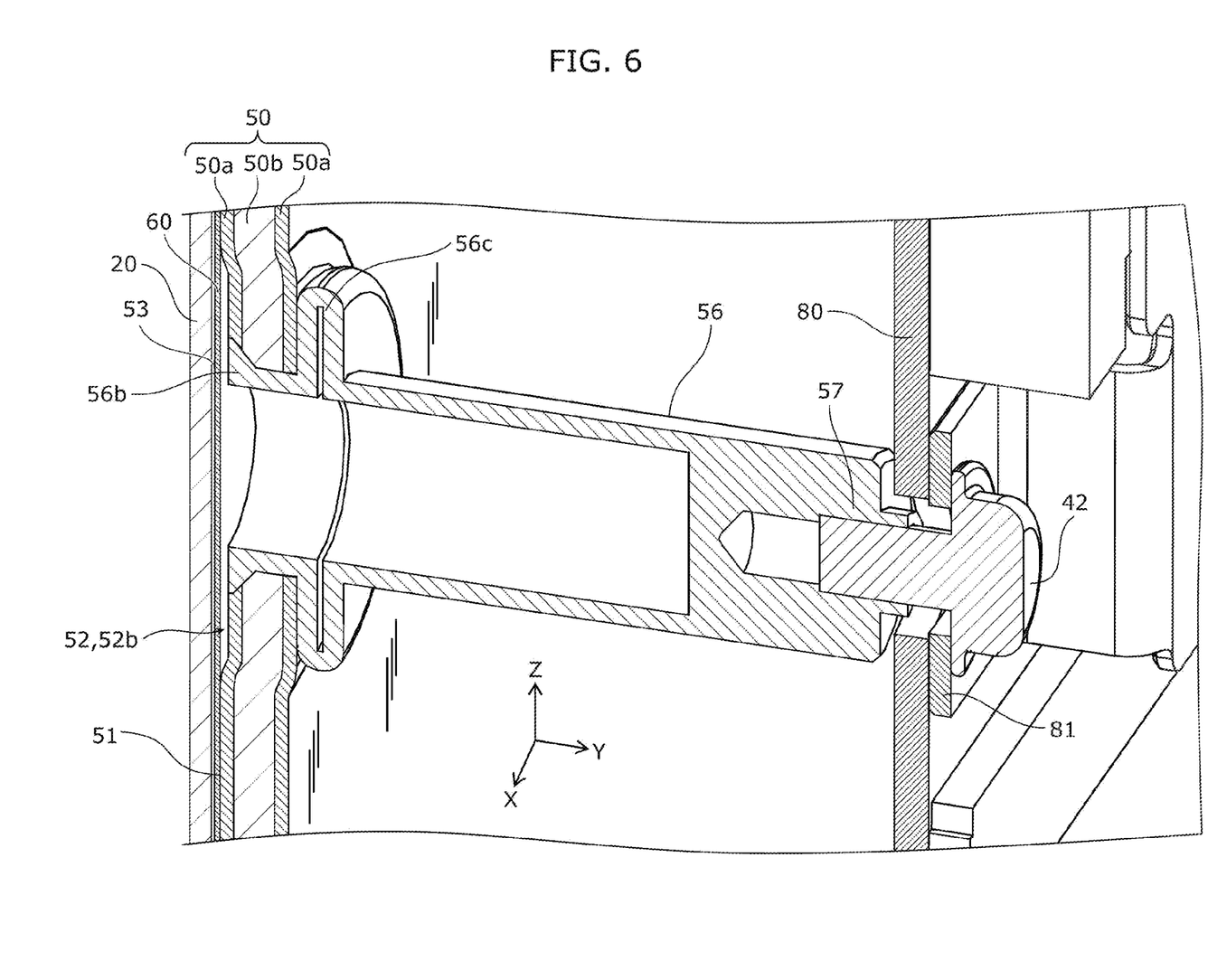
FIG. 6 is a perspective, cross-sectional view of a portion in which a boss is disposed in the image display device according to the embodiment.
Figure 7:
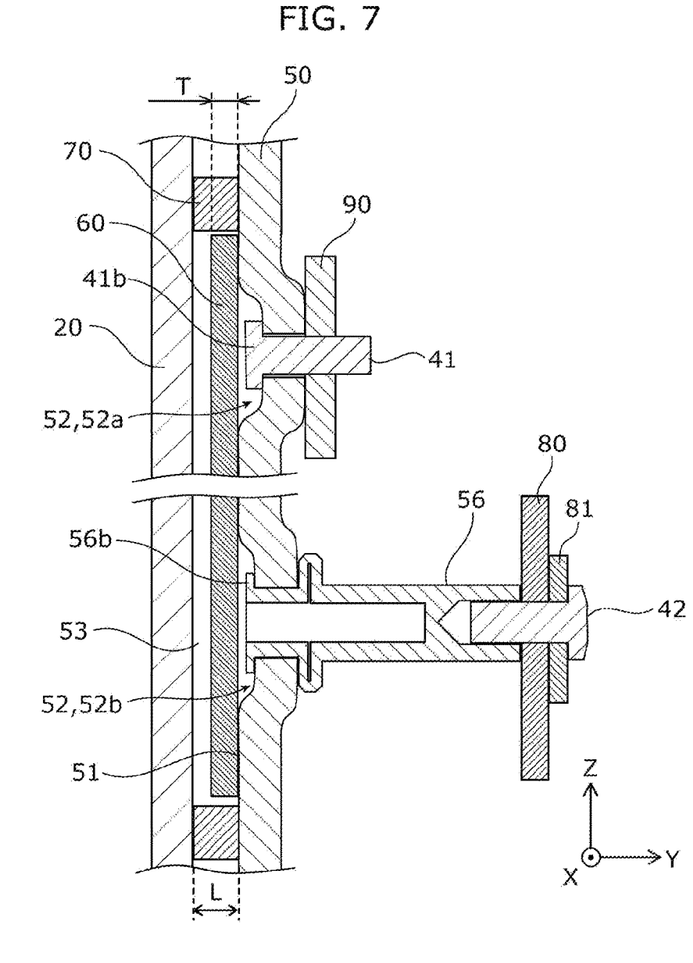
FIG. 7 is a cross-sectional view schematically illustrating a structural relationship between a heat conduction member and members in the vicinity of the heat conduction member according to the embodiment.

FIG. 4 is a perspective view of part of the back surface of support member 50 according to the embodiment. FIG. 4 illustrates an area in which boss 56 and screw 41 are disposed in the back surface of support member 50. FIG. 5 is a perspective, cross-sectional view of a portion in which screw 41 is disposed in image display device 10 according to the embodiment. FIG. 5 illustrates part of a cross section of image display device 10 in the YZ plane along V-V line shown in FIG. 4. FIG. 6 is a perspective, cross-sectional view of a portion in which boss 56 is disposed in image display device 10 according to the embodiment. FIG. 6 illustrates part of a cross section of image display device 10 in the YZ plane along VI-VI line shown in FIG. 4. FIG. 7 is a cross-sectional view schematically illustrating a structural relationship between heat conduction member 60 and members in the vicinity of heat conduction member 60.

As illustrated in FIG. 4, support member 50 disposed on the back surface side of display panel 20 and heat conduction member 60 is provided with screw 41 and boss 56 that protrude from support member 50. As illustrated in FIG. 5 and FIG. 6, each of screw 41 and boss 56 is disposed penetrating recessed portion 52 in support member 50 in the thickness direction (Y axis direction) of support member 50. In order to distinguish recessed portion 52 through which screw 41 penetrates and recessed portion 52 through which boss 56 penetrates, the former is indicated as recessed portion 52a and the latter is indicated as recessed portion 52b.

In this embodiment, support member 50 includes two metal plates 50a of aluminum and resin member 50b sandwiched between these two metal plates 50a. Support member 50 has a thickness of approximately 2 mm to approximately 3 mm, for example. Recessed portion 52a and recessed portion 52b are formed by, for example, performing press work on support member 50. In other words, support member 50 includes recessed portions 52 in panel-facing surface 51 which recess toward the opposite side of display panel 20, as illustrated in FIG. 5 through FIG. 7.

A through hole is formed in recessed portion 52a where screw 41 is disposed. The through hole has an inside diameter that is larger than the outside diameter of shaft portion 41a of screw 41 and is smaller than the outside diameter of head portion 41b of screw 41. As illustrated in FIG. 5, shaft portion 41a of screw 41 is inserted through this through hole to be threadedly connected to threaded hole 91 in mounting bracket 90. With this, support member 50 and mounting bracket 90 are fastened together with screw 41. Since head portion 41b of screw 41 is accommodated in recessed portion 52a in the above-described state, head portion 41b does not protrude from panel-facing surface 51 (except for the inside surface of recessed portion 52a) in an axial direction (Y axis direction) of shaft portion 41a. In other words, the depth of recessed portion 52a is greater than the width of head portion 41b in the axial direction (Y axis direction). The depth of recessed portion 52a is approximately 1 mm to approximately 2 mm, for example.

As illustrated in FIG. 6, a through hole through which end portion 56b of metal rod body included in boss 56 is insertable is formed in recessed portion 52b through which boss 56 is disposed penetrating. End portion 56b is inserted into the through hole and the metal rod body is swaged in an axial direction. With this, diameter enlarged portion 56c of boss 56 is formed on the opposite side of recessed portion 52b in support member 50. As a result, boss 56 is fixed to support member 50. End portion 56b of boss 56 in this state is flush with the bottom face of recessed portion 52b or slightly protrudes from the bottom face. For instance, even if end portion 56b of boss 56 protrudes from the bottom face of recessed portion 52b, the depth of recessed portion 52b is determined such that end portion 56b does not protrude from panel-facing surface 51 of support member 50. The depth of recessed portion 52b is approximately 0.1 mm to approximately 0.5 mm, for example. Internal thread portion 57 is provided in the rear end portion (end portion on the positive side of the Y axis) of boss 56 fixed to support member 50. By threadedly connecting screw 42 that penetrates through board cover 81 and control circuit board 80 to internal thread portion 57, board cover 81 and control circuit board 80 are fixed to boss 56.

As described above, heat conduction member 60 is disposed in contact with panel-facing surface 51 of support member 50 in which a plurality of recessed portions 52 are formed. Specifically, a surface of heat conduction member 60 on which a pressure-sensitive adhesive is applied is attached to panel-facing surface 51 of support member 50. As illustrated in FIG. 2 and FIG. 7, fixing member 70 that fixes display panel 20 to support member 50 is disposed on a side (a side in a direction parallel to XZ plane) of heat conduction member 60. With this, display panel 20 and support member 50 are spaced apart by a thickness of fixing member 70 that is, for example, a double-sided adhesive tape. The expression $T<L$ holds true where the letter L denotes the above-described separation distance as shown in FIG. 7 and the letter T denotes the thickness of heat conduction member 60. In other words, thickness T of heat conduction member 60 is less than separation distance L. For this reason, a space (air gap 53) is provided between display panel 20 and support member 50 in the thickness direction (Y axis direction) of display panel 20. Specifically, since heat conduction member 60 is disposed along panel-facing surface 51 of support member 50 in this embodiment, air gap 53 is provided between heat conduction member 60 and display panel 20. For example, suppose that thickness T of heat conduction member 60 is approximately 0.2 mm and separation distance L is approximately 0.3 mm, air gap 53 of 0.1 mm in thickness is provided between heat conduction member 60 and display panel 20.

As described above, image display device 10 according to the embodiment includes: display panel 20 that displays an image on a front surface; support member 50 that is plate-like and is disposed on a back surface side of display panel 20; fixing member 70; and heat conduction member 60. Fixing member 70 fixes display panel to support member 50 with a distance therebetween. Heat conduction member 60 is disposed between display panel 20 and support member 50. Heat conduction member 60 is a plate-like member, and has a thickness less than a separation distance between display panel 20 and support member 50.

With this configuration, heat conduction member 60 having a thickness less than a width (separation distance L) of a space between display panel 20 and support member 50 is disposed between the space. Specifically, heat conduction member 60 is disposed between display panel 20 and support member 50 without completely eliminating an air gap between display panel 20 and support member 50 while keeping the air gap narrow. With this, heat of display panel can be conducted to support member 50 through heat conduction member 60, and can avoid an effect on display panel 20 which is produced by partial differences in heat dissipation (or heat absorption; interchangeable throughout the embodiment) condition in heat conduction member 60 and support member 50. For example, when panel-facing surface 51 of support member 50 is partially uneven or when there are partial thickness differences in support member 50, an irregularity in a heat dissipation condition resulting from the unevenness or thickness difference is not readily transmitted to display panel 20. As a result, heat dissipation uniformity (spatial uniformity) of display panel 20 improves, thereby reducing occurrences of a display irregularity such as a color irregularity, luminance irregularity, or the like. For example, work of attaching heat conduction member 60 to the entire back surface of display panel is not necessary. For this reason, a structure including display panel 20, heat conduction member 60, and support member 50 can be readily assembled. Furthermore, when some failure or problem occurs during a process of assembling image display device 10, display panel 20 can be retrieved to be reused. Heat conduction member 60 does not act to further increase the space between display panel 20 and support member 50 since thickness T of heat conduction member 60 is less than separation distance L between display panel and support member 50. Therefore, heat conduction member 60 does not inhibit display panel 20 fixed to support member 50 with fixing member 70. In other words, display panel 20 is substantially not subject to reaction force directing away from support member 50 in the arrangement direction (Y axis direction) of display panel 20 and support member 50, in contrast to the case where a space between display panel 20 and support member 50 is completely filled with some member. For this reason, display panel 20 can be more reliably and readily fixed to support member 50. For example, when display panel 20 is fixed to support member 50 with fixing member 70, one of display panel 20 and support member 50 can be pressed against the other of display panel 20 and support member 50 such that fixing member 70 originally having a thickness of L is compressed up to about thickness T of heat conduction member 60. With this, display panel 20 and support member 50 can be more firmly bonded together.

As described above, image display device 10 according to the embodiment can be efficiently manufactured and can achieve improvement in image quality.

For example, a value of the thickness of fixing member 70 after the assembly of image display device 10 may be considered as separation distance L between display panel 20 and support member 50. When there is no great change in the thickness of fixing member 70 before and after the assembly, a value of the thickness of fixing member 70 may be considered as separation distance L. Furthermore, an average of actual measured values of a distance between display panel 20 and support member 50 which are measured at several points may be treated as separation distance L.

In image display device 10, heat conduction member 60 is disposed in contact with one of display panel 20 and support member 50, and an air gap is provided between heat conduction member 60 and the other of display panel 20 and support member 50. To be more specific, heat conduction member 60 is disposed in contact with support member 50, and air gap 53 is provided between heat conduction member 60 and display panel 20 in this embodiment as illustrated in FIG. 7, for example.

With this configuration, air gap 53 having an approximately uniform thickness extends between display panel 20 and heat conduction member 60. Accordingly, display panel 20 is loosely and thermally connected to heat conduction member 60 and support member 50 in a wide area. Therefore, an advantageous effect of preventing an effect on display panel 20 due to partial differences in heat dissipation condition in each of heat conduction member 60 and support member 50 is improved.

Heat conduction member 60 may be in contact with display panel 20, and an air gap may be provided between heat conduction member 60 and support member 50. In this case, heat conduction member 60 and support member 50 are loosely and thermally connected in a wide area. Therefore, an advantageous effect of preventing an effect on display panel 20 due to partial differences in heat dissipation condition in support member 50 is improved.

In this embodiment, heat conduction member 60 is adhered to support member 50. For example, heat conduction member 60 has one surface out of the two surfaces in the thickness direction whose entire surface is applied with a pressure-sensitive adhesive (pressure-sensitive adhesive layer). Heat conduction member 60 is adhered to support member 50 using this pressure-sensitive adhesive layer. A pressure-sensitive adhesive layer is not formed on a surface of heat conduction member 60 opposite the surface on which the pressure-sensitive adhesive layer is formed. Accordingly, heat conduction member 60 is not in direct contact with display panel 20. A pressure-sensitive adhesive layer may be translated into an "adhesive layer".

With this configuration, fixing thin plate-like (sheet-like) heat conduction member 60 to support member 50 stably maintains the position and orientation of heat conduction member 60 in a structure including display panel 20, heat conduction member 60, and support member 50. Therefore, it is possible to stably produce an advantageous effect of preventing an effect on display panel 20 due to heat dissipation condition differences on the back surface side of display panel 20. Even if air bubbles remain between heat conduction member 60 and support member 50, a local reduction in heat dissipation efficiency of display panel 20 due to these air bubbles is unlikely to occur since heat conduction member 60 is not in direct contact with display panel 20. Furthermore, even if an error in attaching heat conduction member 60 to support member 50 occurs, heat conduction member 60 can be removed from support member 50 having relatively high rigidity. Accordingly, support member 50 can be reused. Even if support member 50 is damaged due to removal of heat conduction member 60 from support member 50 and support member 50 is to be discarded, the economic loss caused by discarding support member 50 is less than economic loss caused by discarding display panel 20.

In image display device 10 according to the embodiment, a plurality of fixing members 70 are disposed between display panel 20 and support member 50, and are separately disposed as viewed from an arrangement direction (Y axis direction) of display panel 20 and support member 50 (i.e., in front view) (see FIG. 2, FIG. 3, and FIG. 7). Heat conduction member 60 is disposed between two adjacent fixing members 70 among the plurality of fixing members 70 in the front view.

As described above, separately disposed fixing members 70 can make separation distance L (see FIG. 7) between display panel 20 and support member 50 uniform. Furthermore, the thickness of air gap 53 between display panel 20 and heat conduction member 60 disposed between at least two fixing members 70 can be made uniform. Therefore, the heat dissipation condition of display panel is more reliably made uniform in a wide area of display panel 20. As a result, occurrences of a display irregularity in display panel 20 is more reliably reduced.

In this embodiment, support member 50 includes, in panel-facing surface 51 that faces display panel 20, recessed portion 52 recessed toward the opposite side of display panel 20, as illustrated in FIG. 5 through FIG. 7.

As described above, heat conduction member 60 is disposed without completely eliminating an air gap between display panel 20 and support member 50 while keeping the air gap narrow. Therefore, even if panel-facing surface 51 of support member 50 includes a portion not in contact with heat conduction member 60 (a portion in which thermal connection to heat conduction member 60 is weak), an effect produced by the above is not readily shown in display panel 20. For this reason, even if support member 50 has recessed portions 52, an effect on the image quality of display panel 20 due to presence of spaces between the inside surfaces of recessed portions 52 and heat conduction member 60 is prevented. Furthermore, the spaces can accommodate head portion 41b of screw 41 and end portion 56b of boss 56.

In this embodiment, thickness T of heat conduction member 60 is less than separation distance L, as illustrated in FIG. 7. Heat conduction member 60 has thickness T that is more suitably at least half separation distance L.

With this configuration, bringing a surface of heat conduction member 60 facing one of display panel 20 and support member 50 closer to the one of display panel 20 and support member 50 as much as possible can prevent heat conduction member 60 from contacting the one of display panel 20 and support member 50, while keeping an air gap between display panel 20 and support member 50 as narrow as possible. Accordingly, improvement in heat dissipation efficiency of display panel 20 and a reduction in a heat dissipation irregularity are achieved.

Image display device 10 according to the embodiment has been hereinbefore described. However, as heat conduction member 60 and elements in the vicinity of heat conduction member 60, image display device 10 may have elements different from the elements shown in FIG. 2 through FIG. 7. Accordingly, various variations of heat conduction member 60 and elements in the vicinity of heat conduction member 60, particularly differences from the above-described embodiment, will be described with reference to FIG. 8 and FIG. 9.

[3-1. Variation 1]

Figure 8:
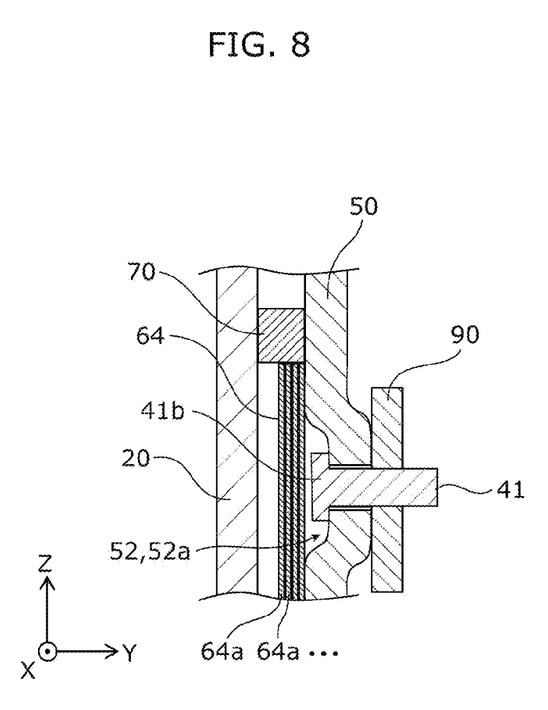
FIG. 8 is a cross-sectional view schematically illustrating a configuration of a heat conduction member according to variation 1 of the embodiment.

FIG. 8 is a cross-sectional view schematically illustrating a configuration of heat conduction member 64 according to variation 1 of the embodiment. Heat conduction member 64 shown in FIG. 8 includes stacked thin-film members (thin-film members 64a).

With this configuration, a change in the number of stacked thin-film members 64a can adjust the thickness of heat conduction member 64, for example. Accordingly, it is possible to manufacture heat conduction members 64 having different thicknesses according to the specifications of products into which these heat conduction members 64 are incorporated. For example, thermal conductivity in the thickness direction of heat conduction member 64 may be changed depending on whether to contain (leave) an air gap between adjacent thin-film members 64a. Therefore, it is possible to manufacture heat conduction members 64 having the same thickness but different thermal conductivity in the thickness direction. Furthermore, types of thin-film members 64a that are to be stacked need not be the same. For example, it is possible to manufacture heat conduction members 64 having the same thickness but different thermal conductivity in the thickness direction by changing combinations of types of thin-film members 64a that are to be stacked.

[3-2. Variation 2]

Figure 9:
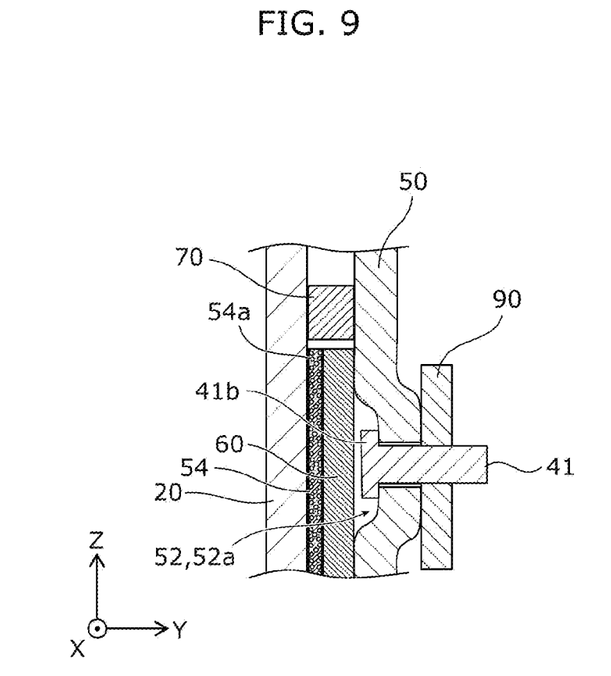
FIG. 9 is a cross-sectional view schematically illustrating configurations of a heat conduction member and an air-cavity contained member according to variation 2 of the embodiment.

FIG. 9 is a cross-sectional view schematically illustrating configurations of heat conduction member 60 and air-cavity contained member 54 according to variation 2 of the embodiment. In FIG. 9, heat conduction member 60 is disposed between display panel 20 and support member 50. Heat conduction member 60 has a width less than a separation distance between display panel 20 and support member 50. This configuration is common to a configuration of heat conduction member 60 and elements in the vicinity of heat conduction member 60 according to the above-described embodiment (see FIG. 7). However, instead of air gap 53, air-cavity contained member 54 is disposed between heat conduction member 60 and display panel 20 in this variation. This differentiates the variation from the above-described embodiment.

In other words, heat conduction member 60 and support member 50 are disposed in contact with each other in this variation, and air-cavity contained member 54 containing air cavity 54a is disposed between heat conduction member 60 and display panel 20.

With this configuration, air-cavity contained member 54 and heat conduction member 60 can be sandwiched between display panel and support member 50 in the thickness direction of air-cavity contained member 54 and heat conduction member 60. Accordingly, heat conduction member 60 can be maintained pressed against panel-facing surface 51 of support member 50, for example. Therefore, heat from heat conduction member 60 is efficiently conducted to support member 50. Even if heat conduction member 60 does not have a pressure-sensitive adhesive layer on the support member 50 side, the position of heat conduction member 60 can be fixed. In other words, heat conduction member 60 can be substantially fixed at a predetermined position without adhesion to support member 50. Therefore, a structure including display panel 20, heat conduction member 60, and support member 50 is readily assembled. Air cavities 54a contained in air-cavity contained member 54 produce the same advantageous effect as air gap 53 according to the above-described embodiment. Specifically, display panel 20 is loosely and thermally connected to heat conduction member 60 and support member 50 since air cavities 54a contained in air-cavity contained member 54 are present between display panel 20 and heat conduction member 60. Therefore, an advantageous effect of preventing an effect on display panel 20 due to partial differences in heat dissipation condition in heat conduction member 60 and support member 50 is improved. More specifically, air-cavity contained member 54 contains dispersedly disposed air cavities 54a in this variation. With this, air-cavity contained member 54 can loosely and thermally connect display panel 20 to heat conduction member 60 and support member 50 in a wide area.

In this variation, air-cavity contained member 54 contains three-dimensionally and dispersedly disposed air cavities 54a. Air-cavity contained member 54 as described above is implemented by, for example, a porous material (urethane foam, porous ceramics, etc.). Air-cavity contained member 54 may be implemented by, for example, a fiber aggregate (steel wool, etc.). The number of air cavities 54a contained in air-cavity contained member 54 is to be at least one. Air cavity 54a may be a single space extending along the XZ plane and having a predetermined thickness in the Y axis direction. Specifically, air-cavity contained member 54 may include, as air cavity 54a, a single, closed or partially opened room that creates an air gap having the same shape and the same size as air gap 53 described in the embodiment, for example.

Heat conduction member 60 may be in contact with display panel 20, and air-cavity contained member 54 may be disposed between heat conduction member 60 and support member 50. In this case, heat conduction member 60 and support member 50 are loosely and thermally connected in a wide area. Therefore, an advantageous effect of preventing an effect on display panel 20 due to partial heat dissipation condition differences in support member 50 is improved.

Other Embodiments

As has been described above, embodiments have been described as examples of techniques disclosed by the present application. However, the techniques according to the present disclosure are not limited to the above-described embodiments, and are applicable to embodiments to which changes, replacements, additions, omissions, etc. have been appropriately made. It is also possible to include a new embodiment by combining structural elements described in the above-described embodiments. Hence, other embodiments will be hereinafter described.

For example, heat conduction member 60 may be disposed separated from both of display panel 20 and support member 50. In other words, an air gap may be provided between heat conduction member 60 and display panel 20 and between heat conduction member 60 and support member 50. For example, spacers for separating heat conduction member 60 from display panel 20 and from support member 50 may be disposed on both sides of heat conduction member 60 in the thickness direction. These spacers may also serve as fixing members that fix display panel 20 to support member 50 with distances therebetween. For example, an end portion of heat conduction member 60 may be connected to fixing member 70 (see FIG. 7) at a position in the middle of fixing member 70 in the thickness direction in this embodiment. With this, heat conduction member 60 can be separated from both display panel 20 and support member 50. As described above, even if air gaps are provided on both sides of heat conduction member 60 in the thickness direction, display panel 20 can be loosely and thermally connected to heat conduction member 60 and support member 50 in a wide area.

It is not essential to use recessed portions 52 in panel-facing surface 51 of support member 50 for installation of screw 41, boss 56, etc. For example, recessed portion 52 in panel-facing surface 51 may accommodate source circuit board 25 disposed on the back surface of display panel 20. Recessed portion 52 may be formed for simply forming a protruding portion on the back surface side of support member 50.

The number of heat conduction members 60 is not particularly limited. For example, when the size of display panel 20 is relatively small (e.g., less than 30 inches), the number of heat conduction members 60 to be disposed between display panel 20 and support member 50 may be one.

Fixing member 70 need not be a member like a double-sided adhesive tape or an adhesive disposed between display panel 20 and support member 50 for fixing display panel 20 to support member 50. For example, a frame-like member that is disposed along the perimeter of display panel 20 and the perimeter of support member 50 and accommodates the peripheral portions of display panel 20 and support member 50 may be used as a fixing member. In other words, any member that mechanically connects display panel 20 to support member 50 with a predetermined distance therebetween can be used as a fixing member.

Display panel 20 may be a display panel of a type different from an organic EL panel. For example, as display panel 20, an LED panel including three types of LEDs disposed in a matrix and emitting red light, blue light, and green light may be disposed in image display device 10. In other words, as long as an image display device includes a display panel that produces heat when displaying an image in the same manner as a spontaneous light emission type display panel, the use of heat conduction member 60 illustrated in FIG. 7 and elements in the vicinity of heat conduction member 60 prevent spatial heat dissipation irregularities in a display panel. As a result, occurrences of a display irregularity such as a color irregularity, luminance irregularity, or the like can be reduced.

The above-described supplemental matters relating to heat conduction member 60 according to the embodiment may be applied to heat conduction member 64 according to variation 1 and heat conduction member 60 according to variation 2.

As has been described above, embodiments have been described as examples of techniques disclosed by the present disclosure. The drawings and detailed description are provided for this purpose. Therefore, the drawings and detailed description may include, among the structural elements described in the drawings and detailed description, not only structural elements essential for problem solving, but also structural elements not essential for problem solving. For this reason, those non-essential structural elements should not be immediately considered essential only because those non-essential structural elements are illustrated and indicated in the drawings and detailed description.

Since the above-described embodiments are presented for exemplifying the techniques in the present disclosure, various changes, replacements, additions, omissions, etc. can be made to these embodiments in the scope of the claims or in the equal scope thereof.

INDUSTRIAL APPLICABILITY

The present disclosure is applicable to television receivers, monitor displays, digital signages, or the like.

The invention claimed is:

1. An image display device comprising:
a display panel that displays an image on a front surface;
a support member that is plate-like and is disposed on a back surface side of the display panel;
a fixing member that fixes the display panel to the support member with a distance therebetween; and
a heat conduction member that is plate-like, is disposed between the display panel and the support member, and has a thickness less than a separation distance between the display panel and the support member, wherein
the heat conduction member is disposed in contact with and adhered to the support member, and
an air gap is provided between the heat conduction member and the display panel.

2. The image display device according to claim 1, wherein
a plurality of fixing members are disposed between the display panel and the support member, and are separately disposed in a front view, the plurality of fixing members each being the fixing member, and
the heat conduction member is disposed between two adjacent fixing members among the plurality of fixing members in the front view.

3. The image display device according to claim 1, wherein
the support member includes, in a panel-facing surface that faces the display panel, a recessed portion recessed toward an opposite side of the display panel.

4. The image display device according to claim 3, further comprising:
a boss that penetrates the recessed portion in the support member, and protrudes rearward, wherein
the boss includes an end portion that does not protrude forward of the panel-facing surface.

5. The image display device according to claim 4, further comprising:
a control circuit board that is fixed to the boss, and controls supply of a signal voltage to the display panel.

6. The image display device according to claim 1, wherein
the heat conduction member has the thickness that is at least half the separation distance.

7. The image display device according to claim 1, wherein
the heat conduction member includes stacked thin-film members.

8. The image display device according to claim 1, wherein
the heat conduction member is disposed in contact with one of the display panel and the support member, and
an air-cavity contained member containing an air cavity is disposed between the heat conduction member and an other of the display panel and the support member.

* * * * *